United States Patent
Fontaine (12) 
(10) Patent No.: US 11,026,359 B1
(45) Date of Patent: Jun. 1, 2021

(54) ELECTROMAGNETIC PULSE SHIELD ASSEMBLY AND ENCLOSURE FOR PROTECTING ELECTRICAL EQUIPMENT

(71) Applicant: John Victor Fontaine, Fort Lauderdale, FL (US)

(72) Inventor: John Victor Fontaine, Fort Lauderdale, FL (US)

(*) Notice: Subject to any disclaimer, the term of this patent is extended or adjusted under 35 U.S.C. 154(b) by 261 days.

(21) Appl. No.: 15/688,538

(22) Filed: Aug. 28, 2017

(51) Int. Cl.
| | |
|---|---|
| *H05K 9/00* | (2006.01) |
| *E04B 1/92* | (2006.01) |
| *E06B 5/18* | (2006.01) |
| *B32B 7/12* | (2006.01) |
| *B32B 15/18* | (2006.01) |
| *B32B 15/08* | (2006.01) |

(52) U.S. Cl.
CPC ............ *H05K 9/0088* (2013.01); *B32B 7/12* (2013.01); *B32B 15/08* (2013.01); *B32B 15/18* (2013.01); *E04B 1/92* (2013.01); *E06B 5/18* (2013.01); *H05K 9/0003* (2013.01); *B32B 2307/202* (2013.01); *B32B 2307/206* (2013.01); *B32B 2307/212* (2013.01); *B32B 2607/00* (2013.01); *E04B 2001/925* (2013.01)

(58) Field of Classification Search
CPC ...... H05K 9/0088; H05K 9/0003; B32B 7/12; B32B 15/08; B32B 15/18; B32B 2307/202; B32B 2307/206; B32B 2307/212; B32B 2607/00; E04B 1/92; E04B 2001/925; E06B 5/18

See application file for complete search history.

(56) References Cited

U.S. PATENT DOCUMENTS

| | | | | |
|---|---|---|---|---|
| 4,660,014 A | * | 4/1987 | Wenaas | H01F 27/362 336/84 C |
| 5,651,171 A | * | 7/1997 | Nelson | G11B 23/0233 206/387.1 |
| 2003/0224182 A1 | * | 12/2003 | Simpson | B32B 7/12 428/437 |
| 2004/0199069 A1 | * | 10/2004 | Connelly | G01R 33/285 600/412 |
| 2005/0253623 A1 | * | 11/2005 | Kong | H01L 27/0251 326/38 |

(Continued)

FOREIGN PATENT DOCUMENTS

| | | | | | |
|---|---|---|---|---|---|
| CN | | 1302484 A | * | 7/2001 | ............. H04B 3/234 |

*Primary Examiner* — Rockshana D Chowdhury
*Assistant Examiner* — Douglas R Burtner
(74) *Attorney, Agent, or Firm* — Oltman, Flynn & Kubler (57) ABSTRACT

A shielding enclosure for blocking electromagnetic pulses to protect electrical equipment includes shield panels having a layered structure of conductive sheets and insulating sheets between the conductive sheets with an outward conductive sheet at a first end of the layered structure and an inward conductive sheet at a second end of the layered structure, and a first ground wire connected to the outward conductive sheet for connecting to a ground, and a second ground wire incorporating a rectifier and connected to the inward conductive sheet for connecting to a ground, the rectifier being oriented to restrict the electric current in the second ground wire to flowing from the inward conductive sheet to the ground; where the shield panels are positioned so that the inward conductive sheet generally faces the electrical equipment and the outward conductive sheet generally faces away from the electrical equipment.

4 Claims, 7 Drawing Sheets

(56) References Cited

U.S. PATENT DOCUMENTS

| | | | |
|---|---|---|---|
| 2014/0008119 A1* | 1/2014 | Brandt | H05K 9/0073 174/382 |
| 2016/0234356 A1* | 8/2016 | Thomas | H05K 9/0069 |
| 2016/0378148 A1* | 12/2016 | Logan | H01R 24/64 361/679.32 |
| 2018/0338396 A1* | 11/2018 | Torita | H05K 9/0088 |
| 2019/0029147 A1* | 1/2019 | Cordes | B32B 15/12 |
| 2019/0357393 A1* | 11/2019 | Cordes | H05K 9/0001 |

\* cited by examiner

ELECTROMAGNETIC PULSE SHIELD ASSEMBLY AND ENCLOSURE FOR PROTECTING ELECTRICAL EQUIPMENT

BACKGROUND OF THE INVENTION

1. Field of the Invention

The present invention relates generally to the field of electrical equipment, and particularly to protecting computers and other electronic devices. More specifically the present invention relates to a shield assembly for blocking magnetic fields to protect electrical equipment from electromagnetic pulses (EMP's), whether natural or man-made. An EMP induces a current within an electronic device, devices, system or grid, hereinafter collectively referred to as "equipment", which can overload and severely damage its circuits and corrupt or destroy any stored data.

The shield assembly includes several shield panels for constructing a shielding enclosure for covering an electrical equipment item to be protected. Each panel is a layered structure formed of alternating layers of conductive sheets and insulating sheets, the panel being oriented so that the outward conductive sheet at a first end of the layered structure can face an EMP source, and an inward conductive sheet at a second end of the layered structure faces the equipment to be protected. A first ground wire is connected to the outward conductive sheet and to a ground such as to an anchor in the actual ground or to an adjacent metal structure such as the framework of a building. A second ground wire incorporating a silicon rectifier is connected to the inward conductive sheet and to a ground. The rectifier is needed because without it, in the event of a poor ground connection, the second ground wire would bypass and short out the panel. The rectifier permits current to flow in only one direction, namely, from the inward conductive sheet to the ground. The layered structure of alternating conductive and insulating sheets is held together by sheet retaining means. The conductive sheets preferably are formed of either iron or an iron alloy. The insulating sheets preferably are formed of a suitable plastic one millimeter thick.

The shielding enclosure is constructed by assembling the panels over and around the top and sides of the equipment item to be protected, or constructed for subsequent placement of the equipment item within the shielding enclosure. A first embodiment is a freestanding enclosure which includes a top panel structure formed of one or more top panels, and side panel structures each formed of one or more side panels. A second embodiment is a room enclosure forming at least part of a room containing equipment, where the top panels are mounted on or integrated into the ceiling of the room to form a top panel structure, and side panels mounted or integrated into each of the walls of the room to form side panel structures. A third embodiment is a building enclosure forming at least part of a building containing equipment, where the top panels are mounted to or integrated into the roof of the building and the side panels are mounted to or integrated into each of the outer walls of the building. Since EMP's generally are expected to originate at high altitude or in space, it is believed that a bottom panel structure is not normally needed. Yet should a bottom panel structure be necessary or desired, it is constructed of bottom panels placed below or on which the equipment rests, or is mounted or integrated into the floor of a room, or into the bottom floor of a building, for the first, second and third embodiments, respectively. For each of these embodiments, the enclosure panels may be adhesively bonded or otherwise fastened together.

2. Description of the Prior Art

In recent years, there have been growing concerns about the security of the power grid as well as of individual electronic devices against powerful electromagnetic pulses. These pulses are caused by sun flares produced during solar storms as the sun goes through cycles. The smallest pulses, known as "transients", may have little or no impact on electric devices. Larger pulses, however, can be extremely severe and would devastate the grid and disable individual devices.

"What is an electromagnetic pulse? It's a powerful burst of electromagnetic energy with enormous destructive potential. An EMP can arise from natural phenomena, such as lightning strikes, or from human activity, such as a nuclear explosion. What makes EMPs ominous is their potential to wreak havoc with a world that now is utterly dependent on electrical technology."

*The Deadly Threat of a Solar Superstorm, The Week*", Dec. 12, 2015.

A particularly notable large pulse, known as the Carrington Event, occurred in 1859 and heated telegraph wires to such an extent that they visibly smoked, causing much of the telegraph network to fail. "A far smaller solar flare in 1989 sent a pulse of radiation that left 6 million people in Quebec without power for up to nine hours." Id.

The other and arguably more immediate threat is posed by pulses produced by nuclear detonations. In 1962, a massive pulse was produced by an atomic test in the Bikini Atoll, which caused an extensive power outage 900 miles away in Hawaii. The size of the area impacted by such pulses can be maximized for military purposes by detonating a nuclear weapon at an altitude high in or above the atmosphere. Regions impacted by pulses from such high altitude detonations are so vast, that as few as three targeted detonations could knock out power systems throughout the continental United States. The urgency of this threat is reflected in recent news reports such as the following, published on Jun. 2, 2017 by Fox New™ and titled "*Newt Gingrich: The North Korean EMP Threat*"

" . . . I hope our military leaders recognize that traditional nuclear war is only half of the threat the Kim Jong-un regime poses.

As I testified at the Senate Committee on Energy and Natural Resources earlier this month, the North Koreans have another offensive option, which they may already be able to execute and would be devastating to the United States—a weaponized electromagnetic pulse.

An electromagnetic pulse, or EMP, occurs when a relatively small but carefully designed nuclear warhead is detonated in the atmosphere. The explosion causes what can best be described as a massive power surge, which can damage or disable electrical devices for hundreds of miles on the ground below. As I told the Senate Committee, such an attack would be catastrophic to the United States because we are an electricity-dependent nation and our grid is ill-prepared to handle it.

I am not talking about simple, isolated, short-term blackouts like those which have occurred in New York, Los Angeles, or Detroit. These blackouts could encompass entire regions. Without proper preparation, the grid disruption (and destruction) caused by an EMP could take is months to years to repair. Non-perishable foods would spoil from lack of refrigeration. Hospitals would run out of life-saving, temperature-controlled medications within days. Dialysis and other medical devices would stop working. Water systems that rely on electricity would stop pumping water and pipes would burst from the weight and pressure. The cascade of consequences of a protracted regional power outage would be devastating."

It is thus an object of the present invention to provide a shielding assembly which can be used to construct an enclosure for shielding electronic devices and systems against EMP's.

It is another object of the present invention to provide such an assembly in which the enclosure is constructed of several shielding panels, each constructed to provide a level of protection appropriate to a specific application, such as one level for protecting a home computer and a higher level for protecting national defense systems.

It is still another object of the present invention to provide such an assembly which includes shielding panels for constructing a shielding enclosure that is customized in size and shape for a specific application, such as to cover a single device, to shield a room or a building containing devices, or a more extensive system.

It is a further object of the present invention to provide such an assembly which, apart from providing protection against damage from EMP's, can also shield one magnet from field of another magnet to maintain magnetic integrity It is finally an object of the present invention to provide such an assembly which is relatively inexpensive to manufacture, and inexpensive and easy to install and use.

SUMMARY OF THE INVENTION

The present invention accomplishes the above-stated objectives, as well as others, as may be determined by a fair reading and interpretation of the entire specification.

Shielded electrical equipment is provided, including an electrical equipment item; and at least one shield panel for blocking electromagnetic pulses including a layered structure of conductive sheets and insulating sheets between the conductive sheets with an outward conductive sheet at a first end of the layered structure and an inward conductive sheet at a second end of the layered structure, the at least one shield panel being positioned relative to the electrical equipment item so that the inward conductive sheet generally faces the electrical equipment item and the outward conductive sheet generally faces away from the electrical equipment item.

The shielded electrical equipment preferably additionally includes a first ground wire connected to the outward conductive sheet for connecting to a ground, and a second ground wire incorporating a rectifier and connected to the inward conductive sheet for connecting to a ground, the rectifier being oriented to restrict the electric current in the second ground wire to flowing from the inward conductive sheet to the ground. The layered structure of conductive sheets and insulating sheets preferably are held together by a sheet retaining structure. The sheet retaining structure preferably includes a plastic cover enveloping the layered structure. The conductive sheets preferably are formed of a metal comprising iron.

A shield assembly is provided for blocking electromagnetic pulses to protect an electrical equipment item, including: at least one shield panel including a layered structure of conductive sheets and insulating sheets between the conductive sheets with an outward conductive sheet at a first end of the layered structure and an inward conductive sheet at a second end of the layered structure, and a first ground wire connected to the outward conductive sheet for connecting to a ground, and a second ground wire incorporating a rectifier and connected to the inward conductive sheet for connecting to a ground, the rectifier being oriented to restrict the electric current in the second ground wire to flowing from the inward conductive sheet to the ground; so that the at least one shield panel can be positioned relative to an electrical equipment item with the inward conductive sheet generally facing the electrical equipment item and the outward conductive sheet generally facing away from the electrical equipment item.

Shielded electrical equipment is further provided, including an electrical equipment item to be protected; and a shielding enclosure for blocking electromagnetic pulses, the shielding enclosure extending around the electrical equipment item and formed of at least one shield panel including a layered structure of conductive sheets and insulating sheets between the conductive sheets with an outward conductive sheet at a first end of the layered structure and an inward conductive sheet at a second end of the layered structure, the at least one shield panel being positioned relative to the electrical equipment item so that the inward conductive sheet generally faces toward the electrical equipment item and the outward conductive sheet generally faces away from the electrical equipment item.

The shielded electrical equipment preferably additionally includes a first ground wire connected to the outward conductive sheet for connecting to a ground, and a second ground wire incorporating a rectifier and connected to the inward conductive sheet for connecting to a ground, the rectifier being oriented within the second ground wire to restrict the electric current in the second ground wire to flowing from the inward conductive sheet to the ground. The layered structure of conductive sheets and insulating sheets is held together by a sheet retaining structure.

The sheet retaining structure preferably includes a plastic cover enveloping the layered structure. The conductive sheets of the at least one panel preferably are formed of a metal comprising iron.

The insulating sheets of each panel preferably are formed of plastic. The shielding enclosure preferably includes a top panel structure formed of at least one top panel for covering the top of the electrical equipment item, and a number of side panel structures each formed of at least one side panel for covering the sides of the electrical equipment item.

The shielding enclosure optionally forms at least part of a room containing the electrical equipment item and having room walls and a room ceiling, including at least one top panel forming a top panel structure defining at least part of the room ceiling, and side panels forming a number of side panel structures defining respectively at least part of each of the room walls, so that the enclosure covers at least the top and sides of the electrical equipment item.

Alternatively, the shielding enclosure may form at least part of a building having building walls and a building roof and containing the electrical equipment item, including at least one top panel forming a top panel structure defining at least part of the building roof, and side panels forming a number of side panel structures defining respectively at least parts of a number of building walls, so that the enclosure covers at least the top and sides of the equipment item.

The shielded electrical equipment preferably additionally includes a bottom panel structure formed of at least one bottom panel and positioned below the electrical equipment item. At least one of the panel structures preferably includes a door opening, and a door comprising a shield panel mounted to the enclosure to be movable to a closed position covering the door opening and to an open position uncovering the door opening. The shield panels making up an enclosure are fastened together.

The at least one shield panel preferably includes at least 35 conductive sheets. The conductive sheets preferably are each 26 gauge and the insulating sheets are each substantially one millimeter thick.

The shield panel of the shielded electrical equipment optionally is formed into a tube to define a tubular panel having a tubular panel longitudinal axis and wrapping around and enclosing the electrical equipment item. Where the electrical equipment item is one of a wire and a bundle of wires and has a wire longitudinal axis, the wire longitudinal axis is substantially parallel to the tubular panel longitudinal axis.

The shield assembly preferably includes a cord having at least one wire extending from a power source to the electrical equipment item, additionally including a blocking device having a capacitor incorporated into the at least one wire. The cord preferably includes at least two wires, and the blocking device preferably includes a capacitor incorporated into each of the at least two wires.

BRIEF DESCRIPTION OF THE DRAWINGS

Various other objects, advantages, and features of the invention will become apparent to those skilled in the art from the following discussion taken in conjunction with the following drawings, in which.

DETAILED DESCRIPTION OF THE PREFERRED EMBODIMENTS

As required, detailed embodiments of the present invention are disclosed herein: however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Reference is now made to the drawings, wherein like characteristics and features of the present invention shown in the various FIGURES are designated by the same reference numerals.

Preferred Embodiments

Referring to FIGS. 1-10, an electromagnetic shield assembly 10 is disclosed including several shield panels 20 for constructing a shielding enclosure 60 to be positioned around electrical equipment E in the form of an electrical equipment item E to be protected. Each panel 20 includes a layered structure 30 formed of alternating layers of conductive sheets 22 and insulating sheets 24, the panel 10 being oriented so that the outward conductive sheet 22O at a first end of the layered structure 20L faces an EMP source, and an inward conductive sheet 22I at the second end of the layered structure 30 faces the equipment E to be protected. See FIG. 1. A first ground wire 32 is connected to the outward conductive sheet 22O and to a ground G such as to an anchor in the actual ground or to an adjacent metal structure such as the framework of a building or the body of a vehicle. A second ground wire 34 incorporating a silicon rectifier 36 is connected to the inward conductive sheet 22I and to a ground G. The rectifier 36 is needed because without it, in the event of a poor ground connection, the second ground wire 34 would bypass and short out the panel 20. The rectifier 36 permits current to flow in only one direction, namely, from the inward conductive sheet 22I to the ground G. The layered structure 30 of alternating conductive and insulating sheets 22 and 24, respectively, is held together by sheet retaining means 40. The conductive sheets 22 preferably are formed of either iron or an iron alloy, but may be of other metals. The insulating sheets 24 preferably are formed of a suitable plastic one millimeter thick.

Figure 1:
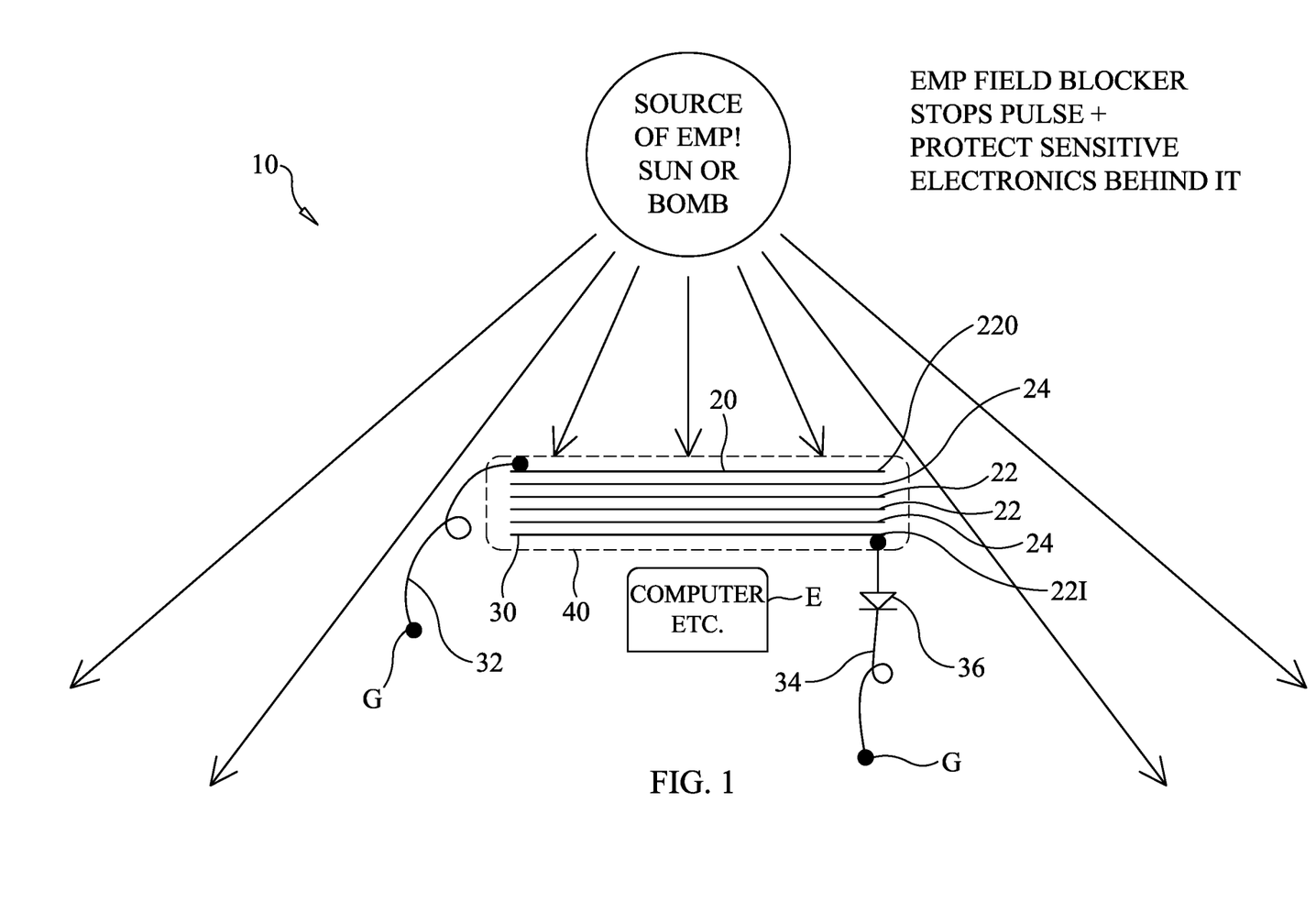
FIG. 1 is a schematic illustration of a shielding panel of the present invention positioned between an electromagnetic pulse source and an electrical equipment item to perform its shielding function, and showing the first and second ground wires.

This construction makes it virtually impossible for an EMP to penetrate the panel 20 and reach the equipment E. The charge induced in the outward conductive sheet 22O by an EMP polarizes charge across opposing sheet 22 faces, which induces a polarized charge in the immediately adjacent conductive sheet, and in the next adjacent conductive sheet 22, through the layered structure 30. The polarized charge diminishes from sheet 22 to sheet 22 through the series of sheets 22 so that the equipment E is subjected to little or no induction.

The shielding enclosure 60 is constructed by either assembling the panels 20 over and around the top and sides of the equipment E to be protected, or by constructing the enclosure 60 in advance and then positioning the enclosure 60 to cover the electrical equipment E. A first embodiment is a freestanding enclosure 60 which includes a top panel structure TPS formed of one or more top panels 20, and side panel structures SPS each formed of one or more side panels 20. The preferred freestanding enclosure 60 is box-shaped so that there are four side panel structures SPS. See FIG. 2.

Figure 2:
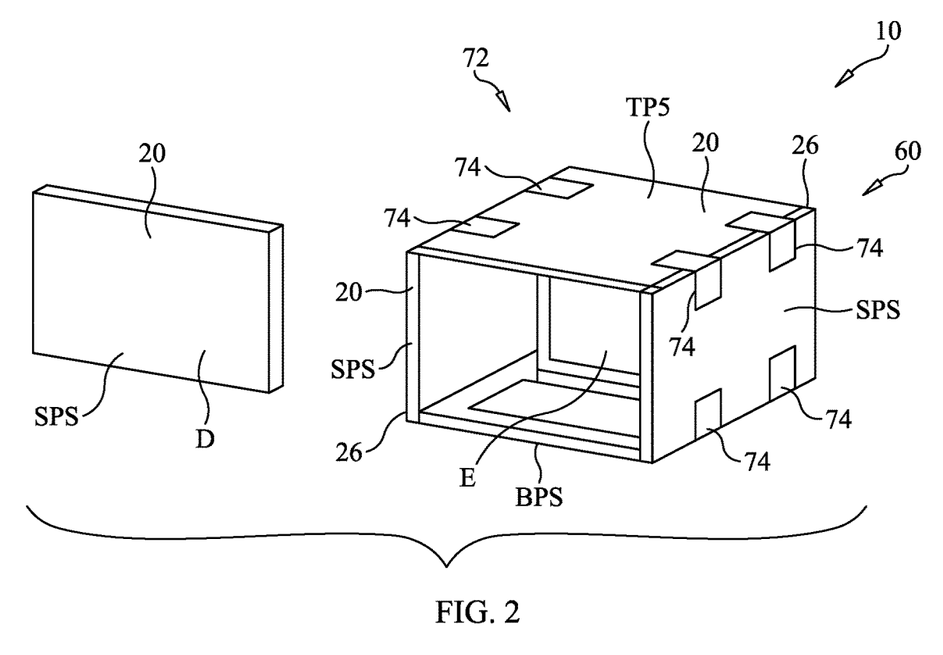
FIG. 2 is a perspective view of a freestanding enclosure containing a single electrical equipment item in the form of a computer, with a door opening in the form of an open side and a door in the form of a side panel structure which can be opened by entirely lifting the given side panel structure away from the rest of the enclosure.
Figure 3:
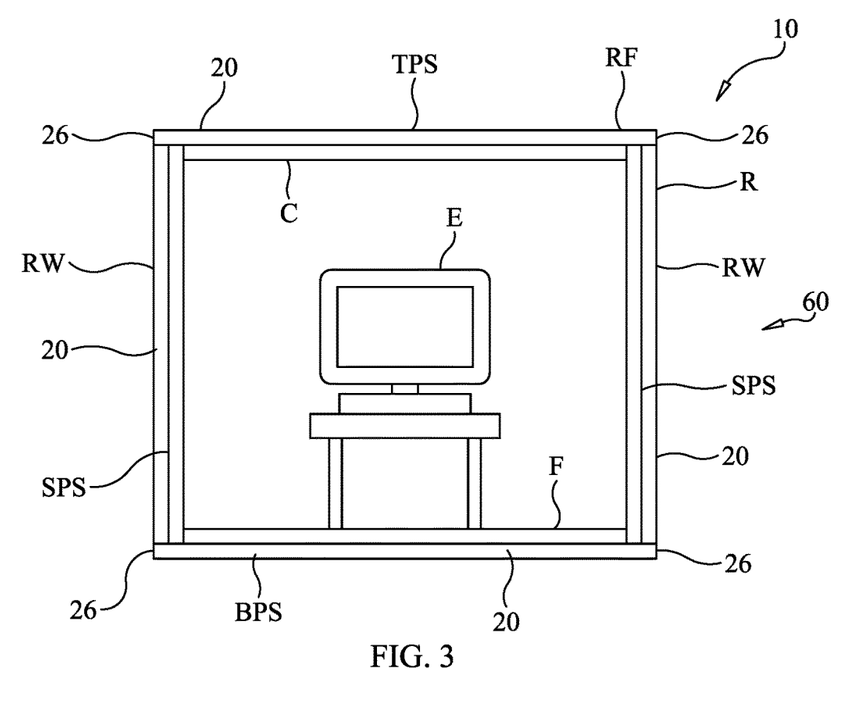
FIG. 3 is a cross-sectional side view of a room enclosure containing an electrical equipment item in the form of a computer on a table.
Figure 4:
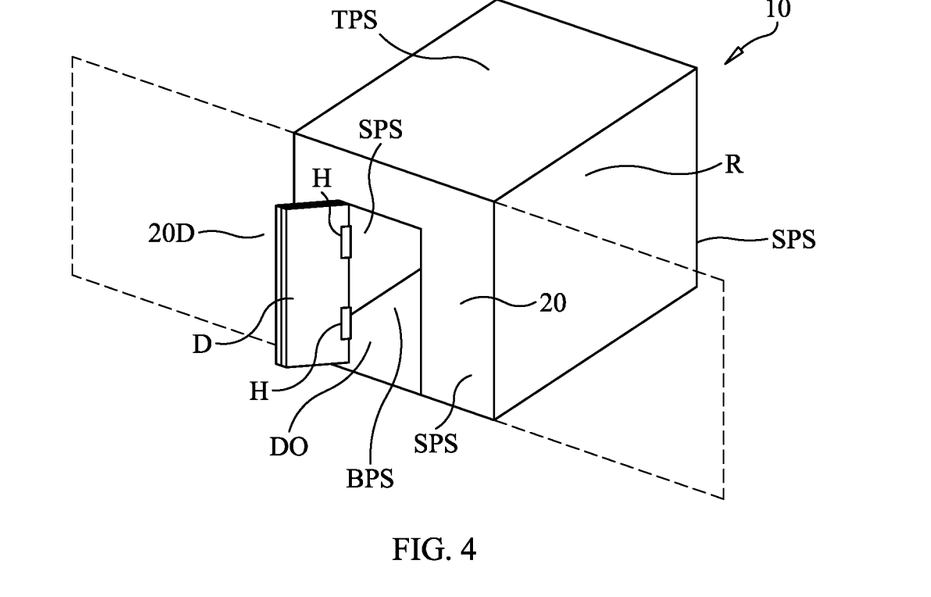
FIG. 4 is a perspective view of a room enclosure having a door opening in one side panel structure and a door incorporating a shield panel. The broken lines indicate building structure extending beyond the room
Figure 5:
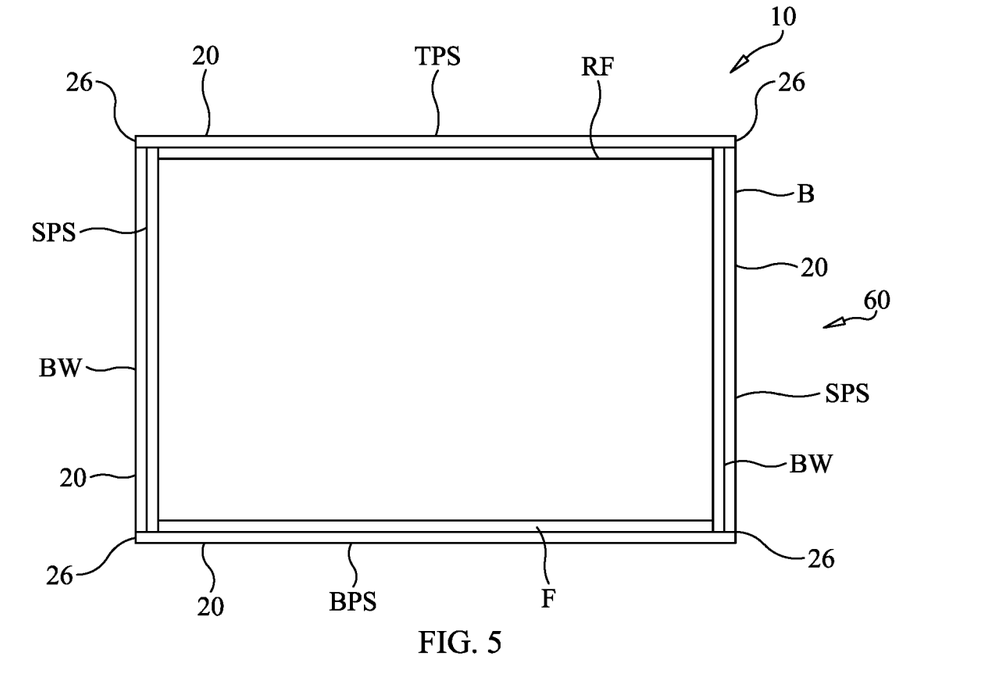
FIG. 5 is a cross-sectional side view of a building enclosure.
Figure 6:
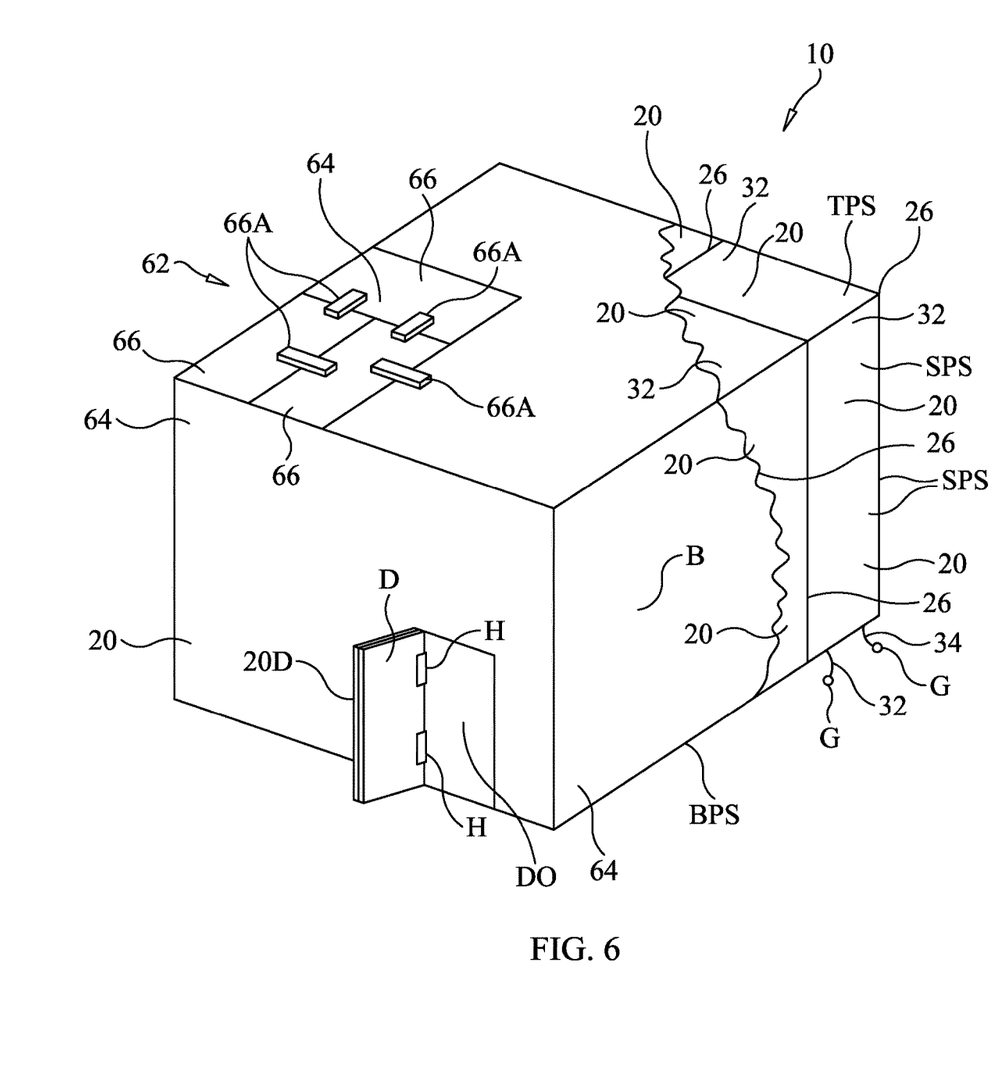
FIG. 6 is a perspective view of a building enclosure having a door opening in one side panel structure and a door incorporating a shield panel. A few of the plywood sheets forming the shell are shown for illustration, but it is understood that the entire shell is formed of such plywood sheets.
Figure 7:
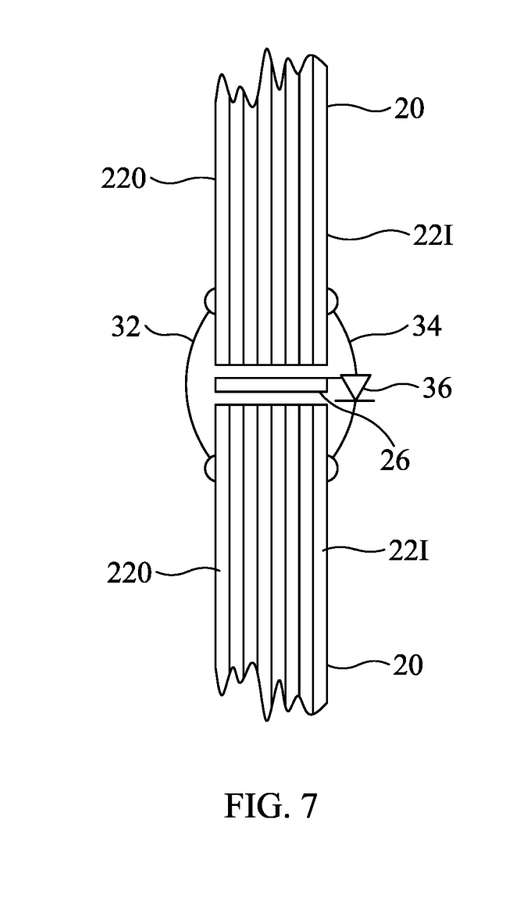
FIG. 7 is a broken away side view of substantially abutting ends of two panels of an enclosure connected in series by first and second ground wires and electrically isolated from each other by a panel end insulating strip of plastic. The shield panels and insulating strip between their panel edges are shown in slightly separated, exploded relation for clarity.

Freestanding enclosure 60 also may be sized to enclose only the chip or mechanical hard drive inside a computer. This version of the first embodiment of enclosure 60 preferably is incorporated into computers during their manufacture, but where possible might be retrofitted into a computer as an aftermarket item. It is contemplated that in virtually all applications this version would be connected to ground such as by ground wires 32 and 34. The major exception to this rule is for computers or other electrical equipment items E mounted in vehicles, including motor vehicles, trains and aircraft. It is highly preferred, that an enclosure 60 mounted inside a vehicle not be grounded and in fact be fully electrically insulated from the frame of the vehicle.

A second embodiment is a room enclosure 60 constructed as part of a room R containing equipment E, where the top panels 20 are mounted on, integrated into or positioned to independently form the ceiling C of the room R to form a top panel structure TPS, and side panels mounted on, integrated into or positioned to independently form each of the room walls RW of the room R to form side panel structures SPS. See FIGS. 3 and 4.

A third embodiment is a building enclosure 60 constructed as part of a building B containing equipment E, where the top panels 20 are mounted on, integrated into or positioned to independently form the roof RF of the building B and the side panels 20 are mounted on, integrated into or positioned to independently form each of the outer walls BW of the building B. See FIGS. 5 and 6.

The shield panels 20 forming an enclosure 60 preferably are fastened together with shield panel fastening means 62 or retained by enclosure containment means 64. Where shield panels 20 are placed edge to edge to form a larger enclosure such as for a room R or an entire building B, a panel end insulating strip 26 preferably of plastic is placed between the adjacent shield panels 20 to prevent the panels 20 from abutting each other and creating an electrical short. To ground shield panels 20 that are above the lowermost panels 20 forming an enclosure 60, the first ground wires 32 are connected to outward conductive sheets 22O of immediately adjacent panels 20, and the second ground wires 34 are connected to the inward conductive sheets 22I of immediately adjacent panels 20. See FIG. 7. In this way, the outward conductive sheets 22O and the inward conductive sheets 22I of the shield panels 20 forming an enclosure 60 are respectively interconnected so that currents from an EMP travel through outward conductive sheets 22O in series to ground wires 32 connected directly to a ground G, and also through inward conductive sheets 22I in series to ground wires 34 connected directly to a ground G. As a result, electric currents from EMPs in upper panels 20 of an enclosure 60 flow in series through adjacent panels 20 to final panels 20, which in most cases are the lowermost panels 20 of the enclosure 60, and then through the ground wires 32 and 34 of the final panel 20 to ground G.

To structurally hold adjacent panels 20 in series to form side panel structures SPS and corners where side panel structures SPS meet to define the given enclosure 60, it is preferred that enclosure containment means 62 take the form of a plywood shell 64 built around or built inside and abutting enclosure 60. The plywood sheets 66 forming the shell 64 are interconnected with crossing boards 66A extending across and nailed to the outward facing surfaces of the plywood sheets 66. See FIG. 6. An external shell 64 can hold the shield panels 20 against the walls BW and roof RF of a building B, and an internal shell 64 can hold shield panels 20 against inward facing surfaces of the walls RW and ceiling C of a room R.

A preferred shield panel fastening means 72 for holding adjacent panels 20 together includes steel or brass panel brackets 74 overlapping and either welded or screwed to respective outward conductive sheets 22O and inward conductive sheets 22I of adjacent shield panels 20. See FIG. 2. Panel brackets 74 not only structurally hold the panels 20 of an enclosure 60 together, but since they are conductive they also can function as a substitute for interconnecting ground wires 32 and 34 conducting electric current flowing through outward conductive sheets 22O of a series of panels 20 and flowing through inward conductive sheets 22I of a series of panels 20 to ground G, normally although not necessarily through the lowermost panels 20.

For each of the first, second and third preferred embodiments of enclosure 60 described above, at least one of the side panel structures SPS preferably includes a door opening DO and a door panel 20D. The door D may be provided independently as the entire enclosure door D or as part of an enclosure door D, and preferably is mounted with hinges H adjacent to the door opening DO to pivot closed to cover the door opening DO and to pivot open to leave the door opening DO uncovered. Alternatively, the door panel 20D may separate entirely from the enclosure 60 so that it can be lifted away from door opening DO, as shown in FIG. 2. The door opening DO may be an open region in a side panel structure SPS or, particularly in the case of the first embodiment of enclosure 60, or may be the entire side panel structure SPS which, when opened, reveals the door opening DO.

Since EMP's generally are expected to originate at high altitude or in space, it is believed that a bottom panel structure is not normally needed. Yet should a bottom panel structure BPS be necessary or desired, it is constructed of bottom panels 20 placed below or on which the equipment E rests, or is mounted on, integrated into or positioned to independently form the floor F of a room R, or into the bottom floor F of a building B, for the first, second and third embodiments, respectively. For each of these embodiments, the panels 20 may be adhesively bonded or otherwise fastened together to form the enclosure 60.

The number of conductive sheets 22 making up a panel 20 is important to its shielding function, but normally the thicknesses of the individual conductive sheets 22 is not. The more conductive sheets 22 there are within a panel 20, the greater is its shielding capability. The amount of the increase in shielding capability provided each added conductive sheet 22, however, becomes less and less with higher numbers of sheets 22. As a practical matter, the number of conductive sheets 22 needed in a panel 20 is the number that reduces induction within the equipment E produced by an anticipated pulse to a negligible or harmless level. Various panels 20, therefore, may be provided containing different numbers of conductive sheets 22, and thus having different panel 20 thicknesses, depending on the amount of shielding needed for a given application. The panel 20 thickness selected depends on the type of equipment E and the anticipated magnitude of the EMP to be protected against. A panel 20 containing an established standard number of conductive sheets 22 may be provided for a variety of common applications, such as 35 conductive sheets. The thinnest commercially available metal sheet is believed to be 26 gauge, so that a panel 20 having 35 conductive sheets 22 would be approximately one inch thick. For national security and military equipment, applicant recommends panels 20 containing 70 conductive sheets 22.

Since the thicknesses of the individual conductive sheets 22 is believed to be irrelevant to panel 20 function, thinner conductive sheets 22 are preferred to minimize panel 20 cost and bulk. An entirely optional but preferred air-tight cover layer 40 such as of a suitable plastic may enclose the entire layered structure 30 of conductive and insulating sheets 22 and 24 forming a panel 20, to function as sheet retaining means 40 for holding the sheets together in mutually abutting relation and for keeping out moisture to prevent corrosion.

For certain applications, such as for vehicles, shield assembly 10 includes special enclosures 60 for individual wires W and for bundles of wires W. Not only must electrical equipment items E be protectively shielded as described above, but wires W leading to the equipment items E must be shielded as well. The reason for this is that the magnetic field of an EMP can induce excessive and destructive electric currents in such wires W which flow to items E containing delicate electrical systems. Therefore, all such wires W must be shielded, and to achieve this, assembly 10 includes essentially tubular panels 20T through which the wires W pass. See FIG. 8. Tubular panels 20T may be constructed around a given wire or bundle of wires W, or may be manufactured in advance and the wires threaded through tubular panels 20T.

Figure 8:
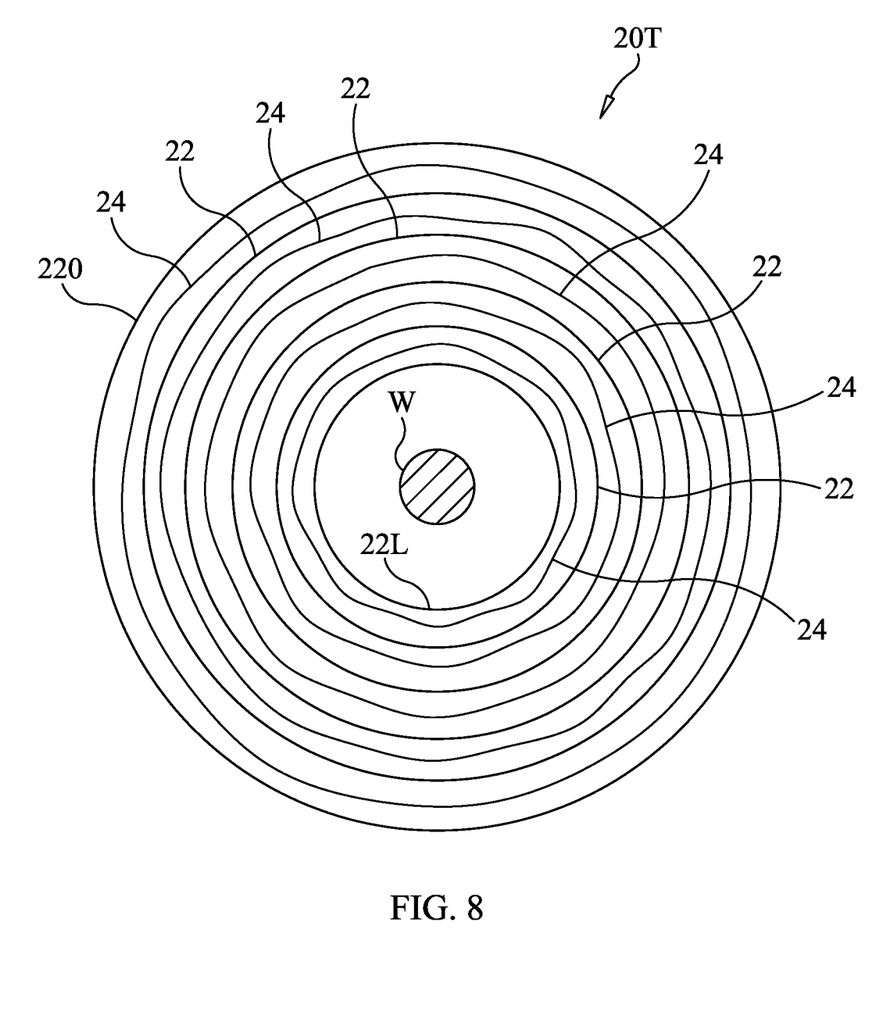
FIG. 8 is cross-sectional view of a wire surrounded and shielded by a tubular panel.

To construct such a tubular panel 20T around a wire or bundle of wires W, a flexible inward conductive sheet 22, preferably in the form of a thin sheet of aluminum foil, is wrapped around the wire or bundle of wires W, and then an insulating sheet 24, preferably in the form of plastic tape, is wrapped around the flexible inward conductive sheet 22I. The wrapping of alternating conductive sheet 22 and insulative sheet 24 is repeated until the tubular panel 20T includes preferably five conductive sheets 22 and five insulating sheets 24. This tubular panel 20T, like the planar or curved panels 20, constitutes an electrical condenser. EMPs and NEMPs, which otherwise would induce direct current in wires or bundles of wires W, are unable to penetrate the tubular panel 20T and thus cannot induce current.

Figure 9:
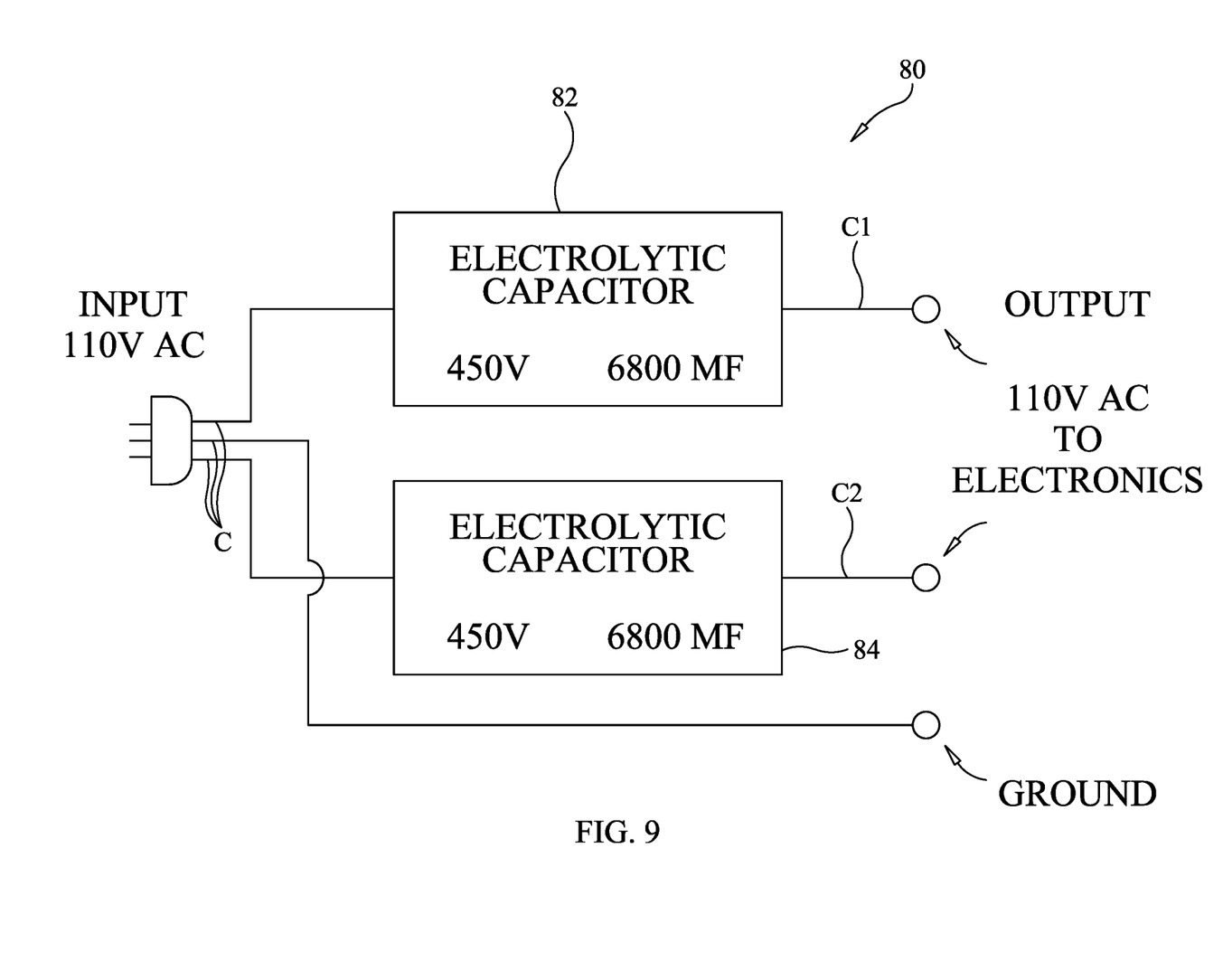
FIG. 9 is a top view of a wire leading to an equipment item incorporating the present blocking device in the positive and ground wires in the form of capacitors, to prevent an electric current induced by an EMP from reaching and damaging the item.

A further element of shield assembly 10 is a blocking device 80 for preventing EMP induced electric currents such as in the power grid from reaching connected electrical items E. Blocking device 80 is intended to be used in addition or alternatively to tubular panels 20T and enclosures 60. Blocking device 80 is placed, for example, in a power cord C extending from a wall outlet to an electrical item E to block an EMP induced electric currents entering a wall outlet from the grid from reaching the electrical item E. As shown in FIG. 9, blocking device 80 includes two electrolytic capacitors 82 and 84 incorporated into the wires C1 and C2 of power cord C. First and second electrolytic capacitors 82 and 84, respectively, preferably are each 450 volt and 6800 microfarad capacitors. This blocking device 80 is a suppression system which eliminates the direct current factor of EMP induced currents, as well as other damaging transients. The second ground wire 34 preferably is connected to inward conductive sheet 22I at an end of the tubular panel T to be able to directly reach ground, and first ground wire 32 is once again connected to the outward conductive sheet 22I. The advantage of this system over other suppression systems is that if an EMP occurs, nothing will be burned out and need to be replaced.

Figure 10:
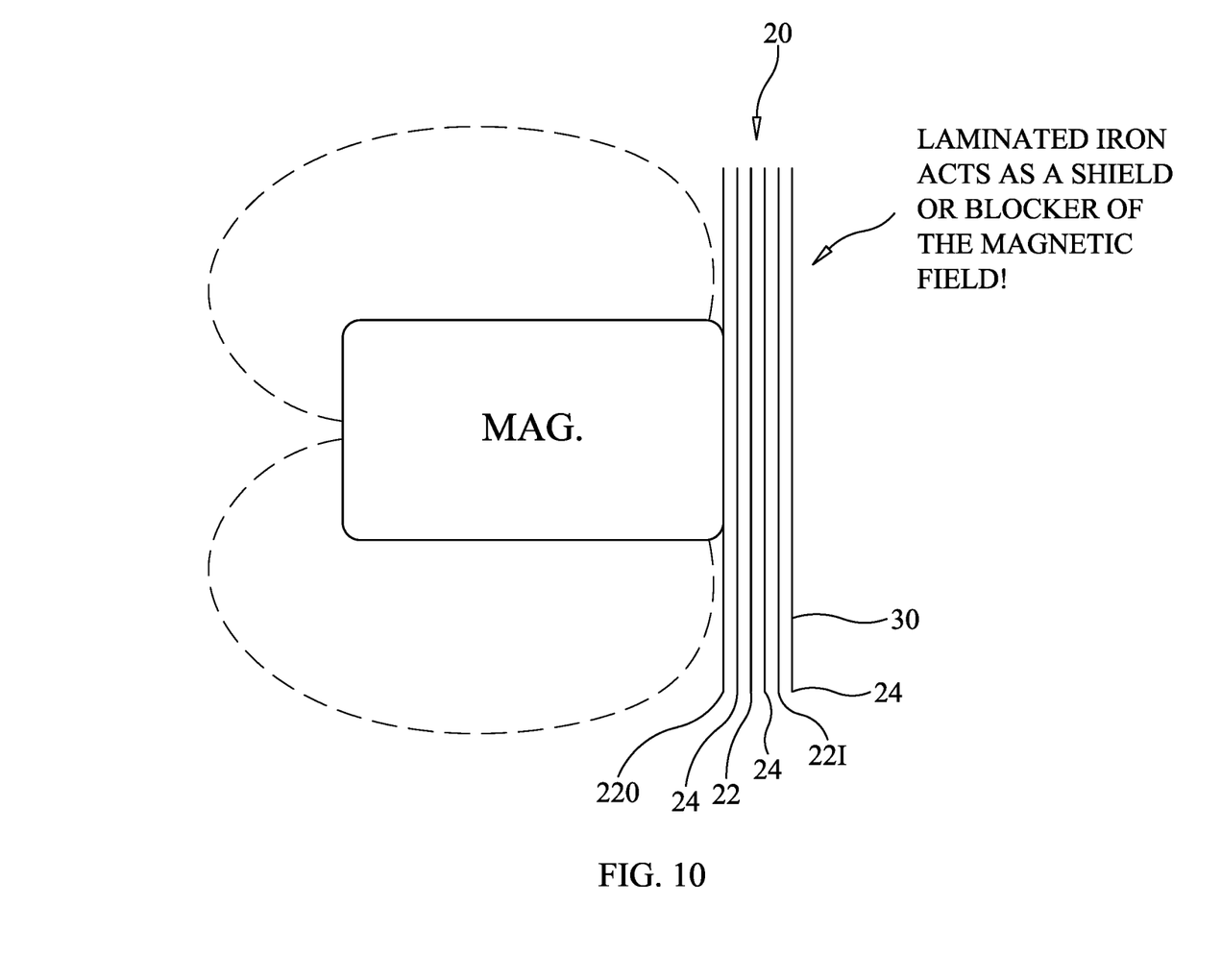
FIG. 10 is a schematic illustration of a contemplated additional use of the present shield panel of blocking the magnetic field of a magnet MAG.

Referring to FIG. 10, applicant contemplates a further purpose for the shield panels 20, described in his own words as follows:

An additional purpose of this system would be to block the field of permanent magnets.

Using the same principle as the EMP blocker, a stack of small gauge metal sheets containing iron, insulated by plastic between them, attached to the magnet (see diagram) will prevent the field from passing through.

Magnetism created by a permanent magnet is pure direct current. The stack of plates or sheets constitute a condenser. Direct current does not pass through a condenser.

This system will allow permanent magnets to be isolated from each other and not interfere with each other's fields, although placed in close proximity.

This invention will make possible more versatile and powerful motors that utilize permanent magnets.

While the invention has been described, disclosed, illustrated and shown in various terms or certain embodiments or modifications which it has assumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim as my invention:

1. Shielded electrical equipment, comprising:
    an electrical equipment item; and
        a shielding enclosure for blocking electromagnetic pulses, said shielding enclosure extending around said electrical equipment item and formed of at least one shield panel comprising a layered structure of conductive sheets and insulating sheets between the conductive sheets with an outward conductive sheet at a first end of said layered structure and an inward conductive sheet at a second end of said layered structure, said at least one shield panel being positioned relative to said electrical equipment item such that said inward conductive sheet generally faces toward said electrical equipment item and said outward conductive sheet generally faces away from said electrical equipment item;
    additionally comprising a first ground wire connected to said outward conductive sheet for connecting to a ground, and a second ground wire incorporating a rectifier and connected to said inward conductive sheet for connecting to a ground, said rectifier being oriented within said ground wire to restrict electric current in the second ground wire to flowing from said inward conductive sheet to the ground.

2. The shielded electrical equipment of claim 1, wherein said layered structure of conductive sheets and insulating sheets is held together by sheet retaining means.

3. The shielded electrical equipment of claim 2, wherein said sheet retaining means comprises a plastic cover enveloping said layered structure.

4. Shielded electrical equipment, comprising:
    an electrical equipment item; and
    a shielding enclosure for blocking electromagnetic pulses, said shielding enclosure extending around said electrical equipment item and formed of at least one shield panel comprising a layered structure of conductive sheets and insulating sheets between the conductive sheets with an outward conductive sheet at a first end of said layered structure and an inward conductive sheet at a second end of said layered structure, said at least one shield panel being positioned relative to said electrical equipment item such that said inward conductive sheet generally faces toward said electrical equipment item and said outward conductive sheet generally faces away from said electrical equipment item;
wherein said at least one shield panel comprises at least 35 conductive sheets.

\* \* \* \* \*